United States Patent
Ordentlich et al.

(10) Patent No.: US 7,623,047 B2
(45) Date of Patent: Nov. 24, 2009

(54) DATA SEQUENCE COMPRESSION

(75) Inventors: Erik Ordentlich, San Jose, CA (US); Marcelo Weinberger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/929,393

(22) Filed: Oct. 30, 2007

(65) Prior Publication Data

US 2009/0112897 A1 Apr. 30, 2009

(51) Int. Cl.
*H03M 7/34* (2006.01)
(52) U.S. Cl. .......................................... 341/51; 341/50
(58) Field of Classification Search ................. 341/50, 341/51; 707/101
See application file for complete search history.

(56) References Cited

U.S. PATENT DOCUMENTS

| | | | |
|---|---|---|---|
| 4,464,650 A * | 8/1984 | Eastman et al. ................ | 341/51 |
| 5,608,396 A | 3/1997 | Cheng et al. | |
| 5,694,128 A | 12/1997 | Kim | |
| 5,710,562 A | 1/1998 | Gormish | |
| 5,729,223 A | 3/1998 | Trissel | |
| 5,886,655 A | 3/1999 | Rust | |
| 5,956,724 A * | 9/1999 | Griffiths ..................... | 707/101 |
| 6,236,341 B1 | 5/2001 | Dorward | |
| 6,906,644 B2 | 6/2005 | Satoh | |
| 7,215,259 B2 | 5/2007 | Kerber et al. | |

FOREIGN PATENT DOCUMENTS

JP 08-242177 A 9/1996

OTHER PUBLICATIONS

HPDC, "Data Sequence Compression", Internat'l Search Report for PCT/US2008/081882, filed Oct. 30, 2008. Report issued by Korean Intellectual Property Office, Apr. 30, 2009.

* cited by examiner

*Primary Examiner*—Jean B Jeanglaude

(57) ABSTRACT

In a method of compressing a data sequence, the data sequence is parsed into data segments, where at least one of the data segments includes a match. In addition, the match is compressed using at least one context model that depends upon one or more coded data symbols that are available to a decoder. An encoder includes a coding unit configured to code at least one of a match offset and a match length of a data segment using one or more context models that depend on previously decodeable data symbols. A computer readable storage medium having a computer program for implementing the method of compressing the data sequence.

17 Claims, 8 Drawing Sheets

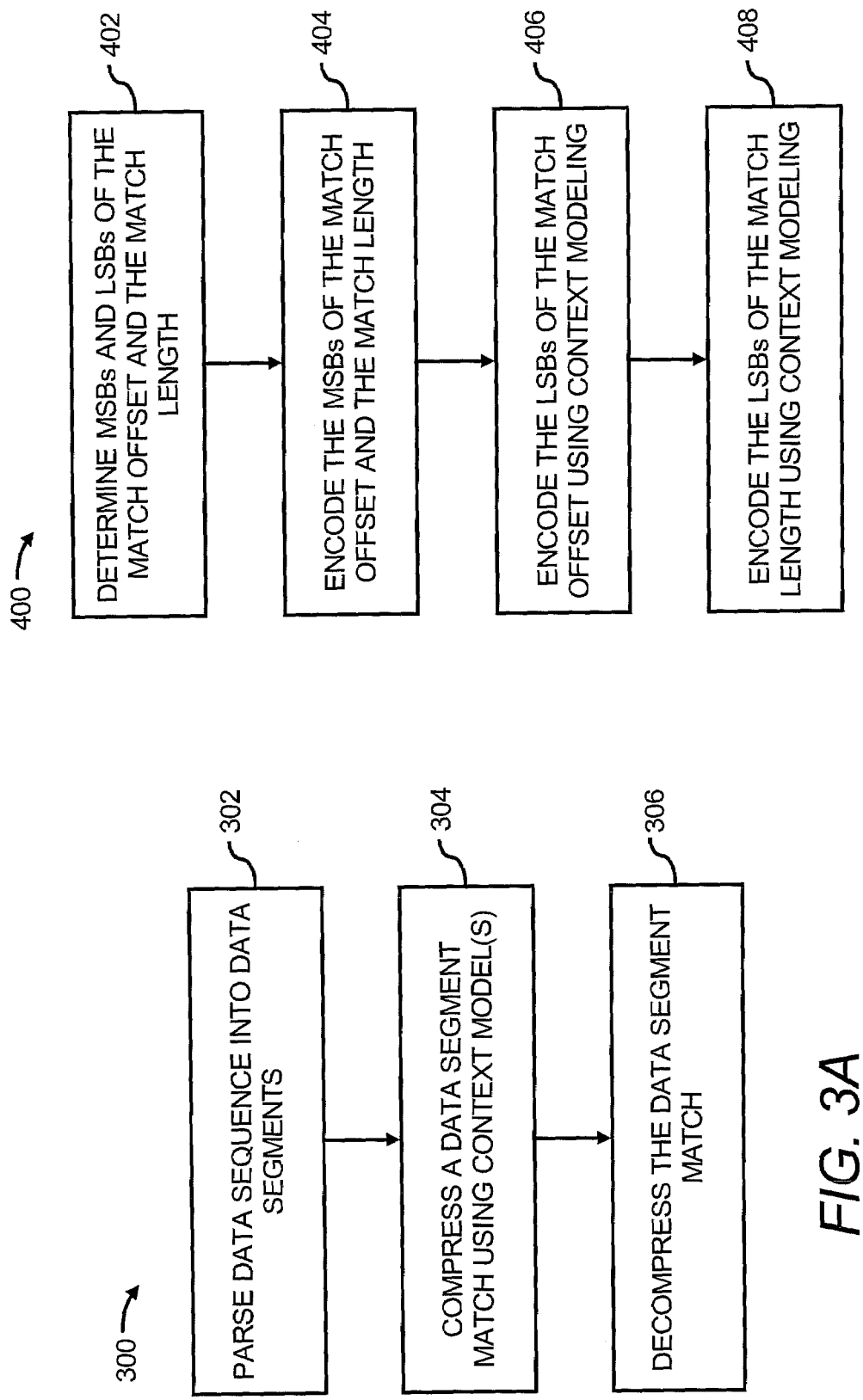

DATA SEQUENCE COMPRESSION

BACKGROUND

Data compression is widely used in the processes of transmitting and storing data to increase the transmission speed and reduce the storage requirements for the data. Data compression is a process that reduces the number of bits of information that are used to represent information in a data file or data stream. An example of a common data compression process is LZ77, in which a data sequence is compressed by indicating portions of the data sequence which have previously occurred in the sequence, which is shown with respect to the coding method 100 depicted in FIG. 1.

As shown in FIG. 1, a plurality of characters forming a data sequence 102 is depicted in their respective input positions 104. Also depicted is the code 106 corresponding to the order in which the data sequence 102 is compressed. In the coding method 100, it is assumed that the data sequence 102 is inputted in the input position order shown therein. As such, the character "A" in the first input position is inputted first and the character "B" in the second input position is inputted second, and so forth.

The character "A" in the first input position is coded as is because there have been no previously inputted or coded characters. The characters that are coded as is are considered literals 108. When the character "B" in the second input position is inputted, it is compared with the previously inputted characters. In the example shown in FIG. 1, the character "B" is also coded as is because there are no preceding matching characters, and is thus also a literal 108. However, when the characters "A" and "B" in the third and fourth positions are inputted and compared with the previously inputted characters, a match 110 is determined with the characters in the first and second input positions. In this case, a match offset 120 and a match length 122 are coded instead of the characters "A" and "B".

The match offset 120 identifies the location of the match 110 (repetitive characters) and the match length 122 identifies the length of the match 110. In the coding method 100, the match offset 120 for the characters "A B" in the third and fourth input positions is "2", which specifies the difference between the current position (position of the next symbol to be processed) and the input position 104 of the first character "A" in the match 110, and the match length 122 is "2" because the match 110 includes two characters "A" and "B".

In addition, when the character "C" in the fifth position is input, it is coded as is because there have been no previously matching characters inputted. Similarly, the characters "D" and "E" in the sixth and seventh positions, respectively, are coded as is for the same reasons. However, when the characters "A B C D E" are input, they are determined to match the characters in the third to the seventh input positions 104. As such, the match 110 is coded with a match offset 120 of "5", which identifies the match 110 as being located 5 positions back from the current position and the match length 122 is "5" because there are five characters in the match 110. The coding method 100 repeats this process to code the remaining characters in the data sequence 102.

When a decoder decompresses the data sequence containing the match offsets and the match lengths, the decoder is able to identify the characters referenced by the matches 110 because the decoder has already received and decoded the characters in the earlier input positions 104.

Variations in manners in which the LZ77 process is implemented have been widely implemented. Examples of these variations include the LZ78, LZW, LZSS, LZMA, as well as other variants thereof.

Another manner in which data is compressed is through context modeling, in which, a probability distribution that models the frequency with which each symbol is expected to occur in each context is associated with each context. By way of example, in a binary stream of zero's and one's, the context is the value of the previous bit. In this example, there are two contexts, one context corresponding to the previous bit being a zero and another context corresponding to the previous bit being a one. Thus, for instance, whenever the previous bit is a zero, there will be a probability distribution on the value of the next bit being a zero or a one.

Under context modeling, compression is generally achieved by assigning shorter codes (or codewords) to data symbols that are more likely to occur and longer codes to data symbols that are less likely to occur. In order to achieve this compression, the data symbols are modeled and the probabilities are assigned to the likelihoods of the data symbol values occurring. By way of example, in an English text sequence, if the context, comprised of the immediately preceding symbol, is "q", it is more probable that the next letter will be a "u" as compared with a "z". As such, compression may be enhanced by assigning a shorter code to the letter "u" as compared to the letter "z". Arithmetic coding is a well known technique for carrying out such a codeword assignment that is especially compatible with context dependent probability assignment. More particularly, in arithmetic coding a sequence of probabilities assigned to symbols are sequentially mapped into a decodable binary codeword whose length is close to the sum of the base 2 logarithms of the inverses of the assigned probabilities.

Although suitable for most data compression operations, improvements upon these processes to further compress data would be beneficial to thereby further reduce bandwidth requirements and storage capacities for the compressed data.

SUMMARY

Disclosed herein is a method of compressing a data sequence. In the method the data sequence is parsed into data segments, where at least one of the data segments includes a match. In addition, the match is compressed using at least one context model that depends upon one or more coded data symbols that are available to a decoder.

Also disclosed is an encoder which includes a coding unit configured to code at least one of a match offset and a match length of a data segment using one or more context models that depend on previously decodeable data symbols.

Further disclosed herein is a computer readable storage medium on which is embedded one or more computer programs, where the one or more computer programs implement a method for compressing a data sequence. The one or more computer programs include a set of instructions for: parsing the data sequence into data segments, where at least one of the data segments includes a match having a match offset and a match length; and compressing at least one of the match offset and the match length using at least one context model that depends upon one or more coded data symbols that are available to a decoder.

Still further disclosed herein is a method of decompressing a coded data sequence. In the method, a coded data segment is received, where the coded data segment includes at least one of a modified match offset and a modified match length of the data segment that has been coded using one or more context models that depends upon one or more coded data symbols that are available to a decoder. In addition, the received coded data segment is decompressed.

BRIEF DESCRIPTION OF THE DRAWINGS

Features of the present invention will become apparent to those skilled in the art from the following description with reference to the figures, in which:

FIG. 3A depicts a flow diagram of a method of compressing and decompressing a data sequence, according to an embodiment of the invention;

FIG. 4 depicts a flow diagram of a method of using context modeling to compress the least significant bits of a match offset and a match length, according to an embodiment of the invention;

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a system and method for compressing a data sequence through use of at least one context model. More particularly, the system and method disclosed herein are configured to compress matches using the at least one context model. Still more particularly, the system and method disclosed herein are configured to compress the least significant bits (LSBs) of the match offsets and the LSBs of the match lengths of the matches. Also disclosed herein are a system and method for decompressing a data sequence that has been compressed through use of the at least one context model.

In one regard, compression and decompression of the matches in general, and the LSBs of the match offsets and the LSBs of the match lengths in particular, are designed to yield relatively smaller compressed bitstream sizes relative to conventional compression algorithms, such as, LZ77, LZMA, and the like. The increased compression is also intended to translate into reduced system memory requirements, which are intended to result in cost savings in terms of the hardware required to store and process the data sequences.

Also disclosed herein is an example of an instantiation of the disclosed system and method for compressing a data sequence. The example is made with respect to processor-executable code. As described in greater detail herein below, the executable code may be labeled to include context models for compressing literals, match offsets, and match lengths of the executable code. More particularly, the LSBs of the match offsets and the match lengths may be compressed through use of context models to, for instance, reduce the storage requirements of the executable code. In one regard, therefore, the methods disclosed herein may be implemented as an enhancement to existing compression processes, such as, the LZMA algorithm.

Figure 2A:
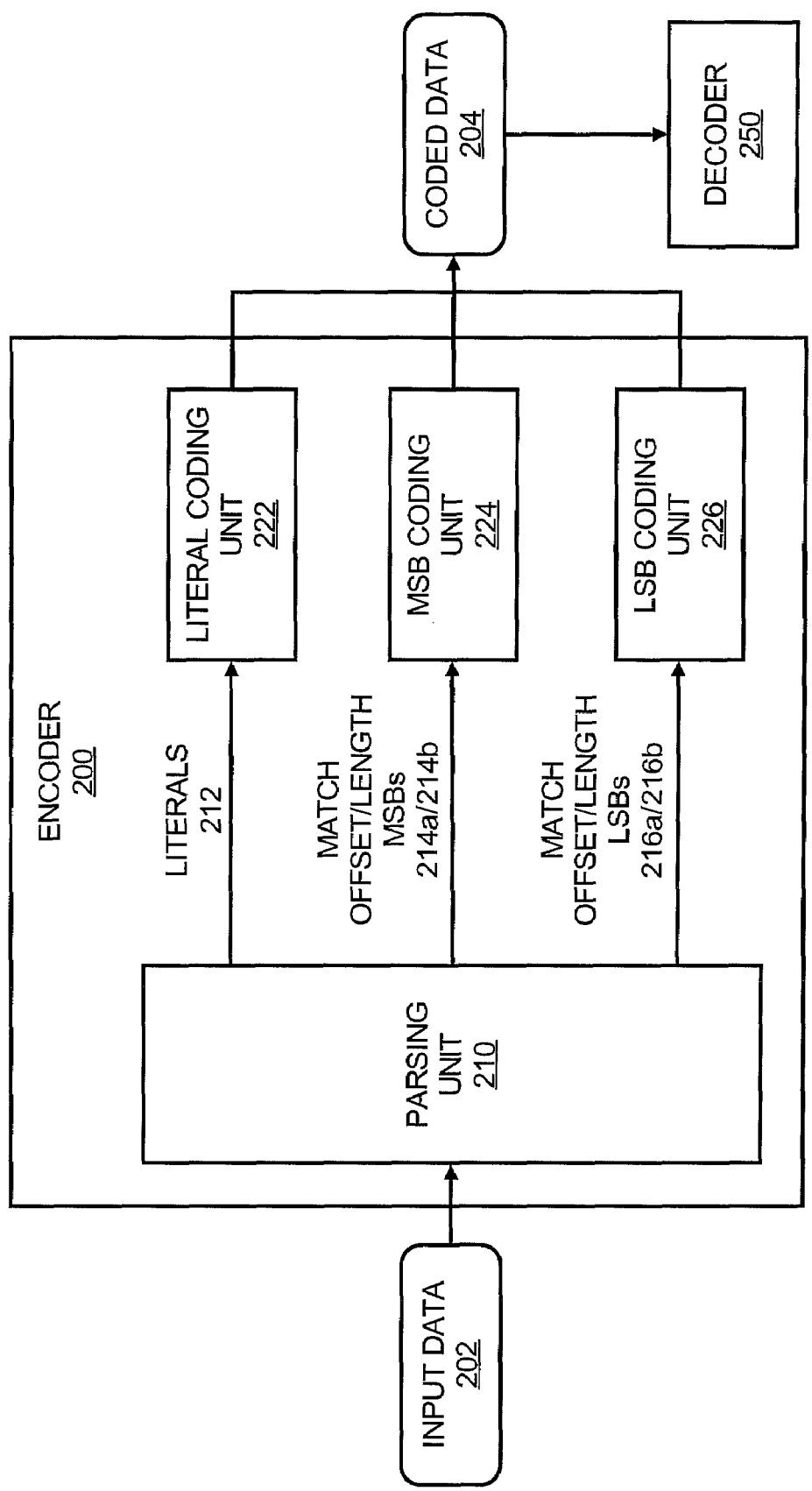
FIG. 2A shows a block diagram of an encoder configured to perform various functions described herein, according to an embodiment of the invention.

With reference first to FIG. 2A, there is shown a block diagram of an encoder 200 configured to perform various functions described herein, according to an example. It should be understood that the following description of the encoder 200 depicted in FIG. 2A is but one manner of a variety of different manners in which the encoder 200 described herein may be configured. In addition, it should be understood that the encoder 200 may include additional components and that some of the components described herein may be removed and/or modified without departing from a scope of the encoder 200.

Generally speaking, the encoder 200 is configured to convert a stream of input data 202 into a stream of coded data 204. The encoder 200 may receive the input data stream 202 from a storage device, such as a random access memory (RAM) of a computer system, a read-only memory (ROM) of a computer system, a floppy disk, a compact disk, a digital video disk, a magnetic disk, or other data storage media. In addition, or alternatively, the encoder 200 may receive the stream of data over a network, such as, an intranet, the Internet, etc. In any respect, the encoder 200 may comprise any reasonably suitable hardware component or software program designed to implement the various functions described herein.

The encoder 200 may also transmit the coded data 204 to any of the storage devices and networks described above or to other storage devices and networks. In addition, the coded data 204 may be decoded by a decoder 250 configured to reconstruct the data stream 202 from the coded data 204 in any of a variety of manners, as discussed in greater detail herein below.

Figure 1:
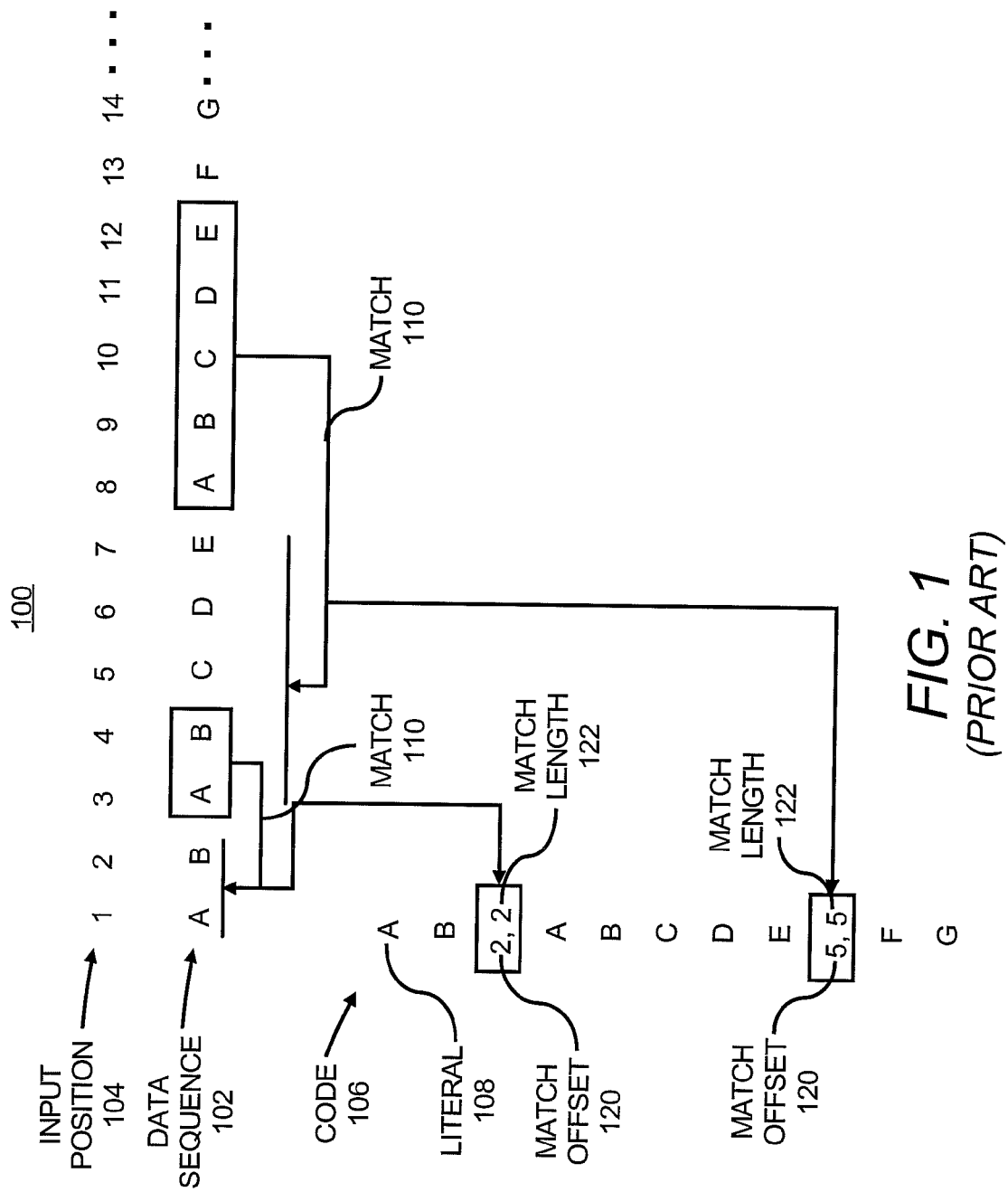
FIG. 1 shows a block diagram of a conventional data sequence compression process.

The encoder 200 is depicted as including a parsing unit 210, a literal coding unit 222, a most significant bit (MSB) coding unit 224, and a least significant bit (LSB) coding unit 226. The parsing unit 210 is configured to receive the stream of input data 202 and to determine whether a current data segment matches any previous data segments. The parsing unit 210 therefore operates to segment the data stream of the input data 202, for instance, as described above with respect to the coding method 100 depicted in FIG. 1. The data stream may comprise any reasonably suitable type of data stream known to be compressed, such as, text, audio, video, executable codes, etc.

Thus, for instance, the parsing unit 210 is configured to identify whether recently received data symbols are literals 212, which are data segments that either do not match previous data or are not part of sufficiently long matches. For matches 110, the parsing unit 210 is also configured to produce a sequence of match offsets, which describe a number of data symbols away from a current sequence of data where previous matching data may be found. In addition, the parsing unit 210 is configured to produce a corresponding sequence of match lengths, which indicates a number of data symbols contained in a match.

Although the parsing unit 210 has been depicted as forming part of the encoder 200, it should be understood that the parsing unit 210 may comprise a unit that is separate from the encoder 200, without departing from a scope of the encoder 200 described herein.

The encoder 200 is configured to encode the parsed data segments in various manners according to whether the data segments are literals 212 or matches 110. More particularly, for instance, the encoder 200 is configured to invoke or implement the literal coding unit 222 to code data segments identified as literals 212. The literal coding unit 222 may operate in any reasonably suitable manner to code the literals 212, such as those manners described in LZ77, LZMA, and the like.

When the data segments are matches 110, the encoder 200 is configured to invoke or implement the MSB coding unit 224 and the LSB coding unit 226. The MSB coding unit 224 may be implemented to code the match offset MSBs 214a and the match length MSBs 214b in any reasonably suitable manner, such as, those manners described in LZ77, LZMA, and the like. The LSB coding unit 226, however, may be implemented to code the match offset LSBs 216a and the match length LSBs 216b using context modeling techniques, as described in greater detail herein below.

More particularly, the encoder 200 may compress data segments of the sequence or stream of input data 202 through use of context modeling, where each symbol in a data stream is associated with a context that may be determined from previously coded symbols. In other words, through use of context modeling, the compression of current data segments may depend upon one or more previously coded data segments that are available to a decoder. As such, for instance, the context may be as simple as the value of the immediately preceding symbol, or the context may be a more general function of the suffix of the data segments that have been previously compressed preceding that symbol, etc.

As discussed above, associated with each context is a probability distribution that models the frequency with which each symbol (in this case the match offset and match length LSBs) is expected to occur in each context. In addition, compression is generally achieved by assigning shorter codes (or codewords) to match offsets and match lengths that are more likely to occur and longer codes to match offsets and match lengths that are less likely to occur. In order to achieve this compression, the match offsets and match lengths are modeled and probabilities are assigned to the likelihoods of the match offsets and match lengths occurring.

Figure 2B:
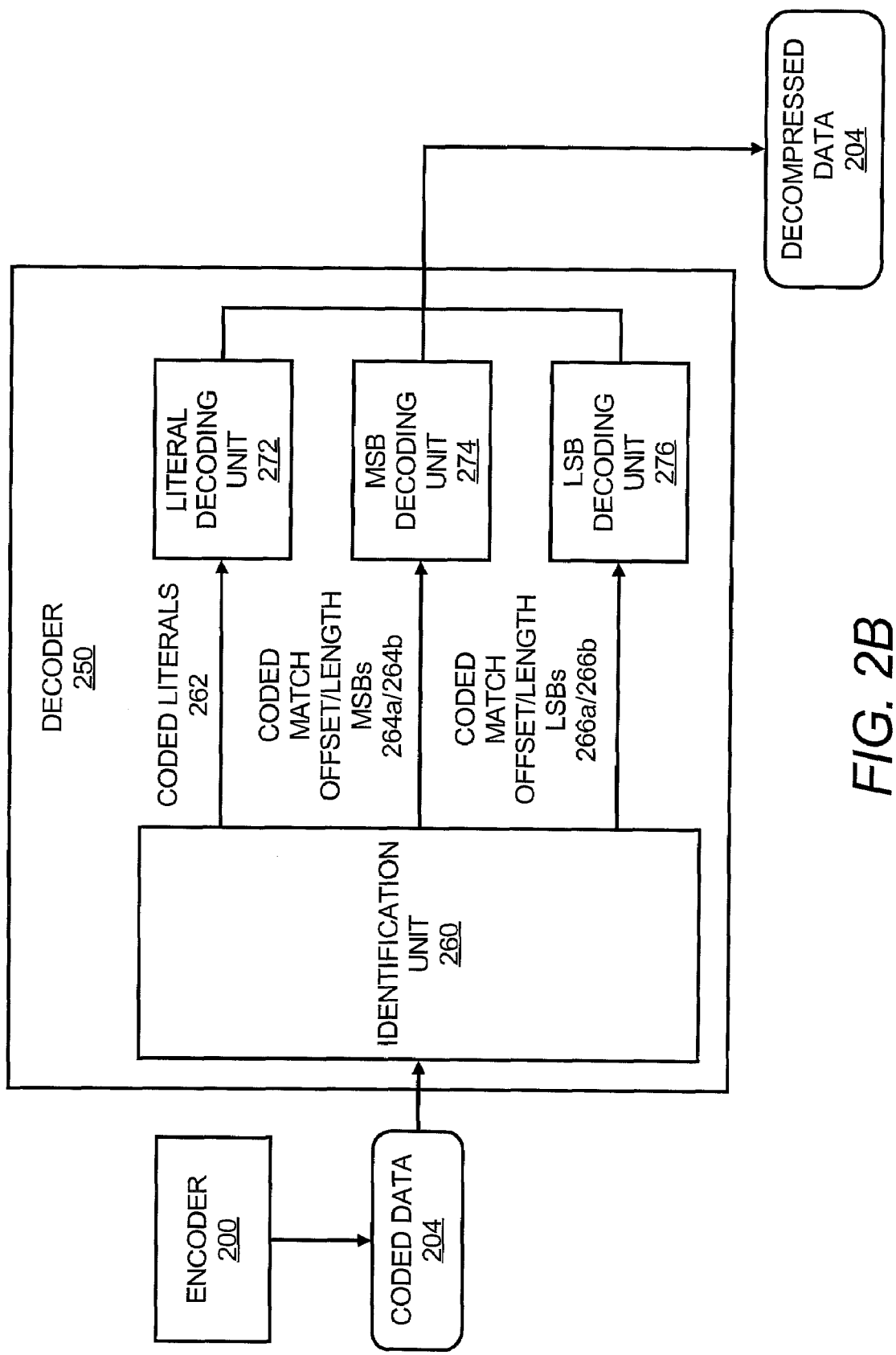
FIG. 2B shows a block diagram of a decoder configured to perform various functions described herein, according to an embodiment of the invention.

With reference now to FIG. 2B, there is shown a block diagram of a decoder 250 configured to perform various functions described herein, according to an example. It should be understood that the following description of the decoder 250 depicted in FIG. 2B is but one manner of a variety of different manners in which the decoder 250 described herein may be configured. In addition, it should be understood that the decoder 250 may include additional components and that some of the components described herein may be removed and/or modified without departing from a scope of the decoder 250.

Generally speaking, the decoder 250 is configured to decompress data 204 that has been coded by the encoder 200. The decoder 250 may receive the coded data 204 directly from the encoder 200 or the decoder 250 may receive the coded data 204 from a data storage unit. In any respect, the decoder 250 may comprise any reasonably suitable hardware component or software program designed to implement the various functions described herein.

The decoder 250 is depicted as including an identification unit 260, a literal decoding unit 272, a most significant bit (MSB) decoding unit 274, and a least significant bit (LSB) decoding unit 276. The identification unit 260 is configured to receive the coded data 204 and to determine whether the data segments forming the coded data 204 are coded literals 262, coded match offset/length MSBs 264a/264b, or coded match offset/length LSBs 266a/266b.

More particularly, for instance, the encoder 200 may flag the data about to be compressed as a literal (flag=0) or a match (flag=1) using binary flags during a compression operation. The encoder 200 may also compress the flags along with the data. The decoder 250 receives the coded data 204, including the coded flag information, and the identification unit 260 decompresses the coded flag information. The identification unit 260 may then use the decompressed flag information to identify whether the data segment associated with a particular flag is a literal or a match.

When the coded data segments comprise coded literals 262, the decoder 250 is configured to invoke or implement the literal decoding unit 272 to decode the coded literals 262 according to the manner in which the literals 212 were coded. When the coded data segments comprise coded matches, the decoder 250 is configured to invoke or implement the MSB decoding unit 274 to decode the coded match offset/length MSBs 264a/264b and to invoke or implement the LSB decoding unit 276 to decode the coded match offset/length LSBs 266a/266b. The MSB decoding unit 274 may decode the match offset MSBs 264a and the match length MSBs 264b in any reasonably suitable manner. However, the LSB decoding unit 276 may decode the match offset LSBs 266a and the match length LSBs 266b as described in greater detail herein below. More particularly, for instance, the decoder 250 may decompress the data segments coded through use of context modeling by the encoder 200.

In light of the foregoing discussion, the encoder 200 may implement one or more of the following methods to use context modeling in compressing the match offset LSBs 216a and the match length LSBs 216b of data segments identified as matches 110. Various manners in which the encoder 200 may operate to encode a stream of input data 202 are described with respect to the following flow diagrams. In addition, various manners in which the decoder 250 may operate to decode the coded stream of data 204 are also described with respect to the following flow diagrams. The descriptions of the following flow diagrams are described with particular reference to the encoder 200 depicted in FIG. 2A and the decoder 250 depicted in FIG. 2B. It should, however, be understood that the methods depicted in the following flow diagrams may be performed by an encoder whose components differ from or comprise alterations of the components depicted in FIGS. 2A and 2B, without departing from a scope of the methods described herein.

In addition, it should be understood that the following descriptions of the methods are but a small number of manners of a variety of different manners in which the methods may be implemented. Moreover, it should be understood that some or all of the following methods may include additional steps and that some of the steps described therein may be removed and/or modified without departing from respective scopes of the following methods.

With reference first to FIG. 3A, there is shown a flow diagram of a method 300 of compressing and decompressing a data sequence, according to an example. Generally speaking, steps 302 and 304 contained in the method 300 may be implemented by an encoder 200 to compress a sequence or stream of input data 202 and step 306 may be implemented by a decoder 250 to decompress the sequence or stream of coded data 204.

As shown in FIG. 3A, the encoder 200 may parse the input data sequence 202 into data segments at step 302. The data segments may comprise, for instance, one or more sections or sequences of characters or symbols forming the input data 202. At step 304, the encoder 200 may compress a data segment determined to comprise a match 110 using at least one context model. In addition, at step 306, the decoder 250 may decode the compressed data segment.

Figure 3B:
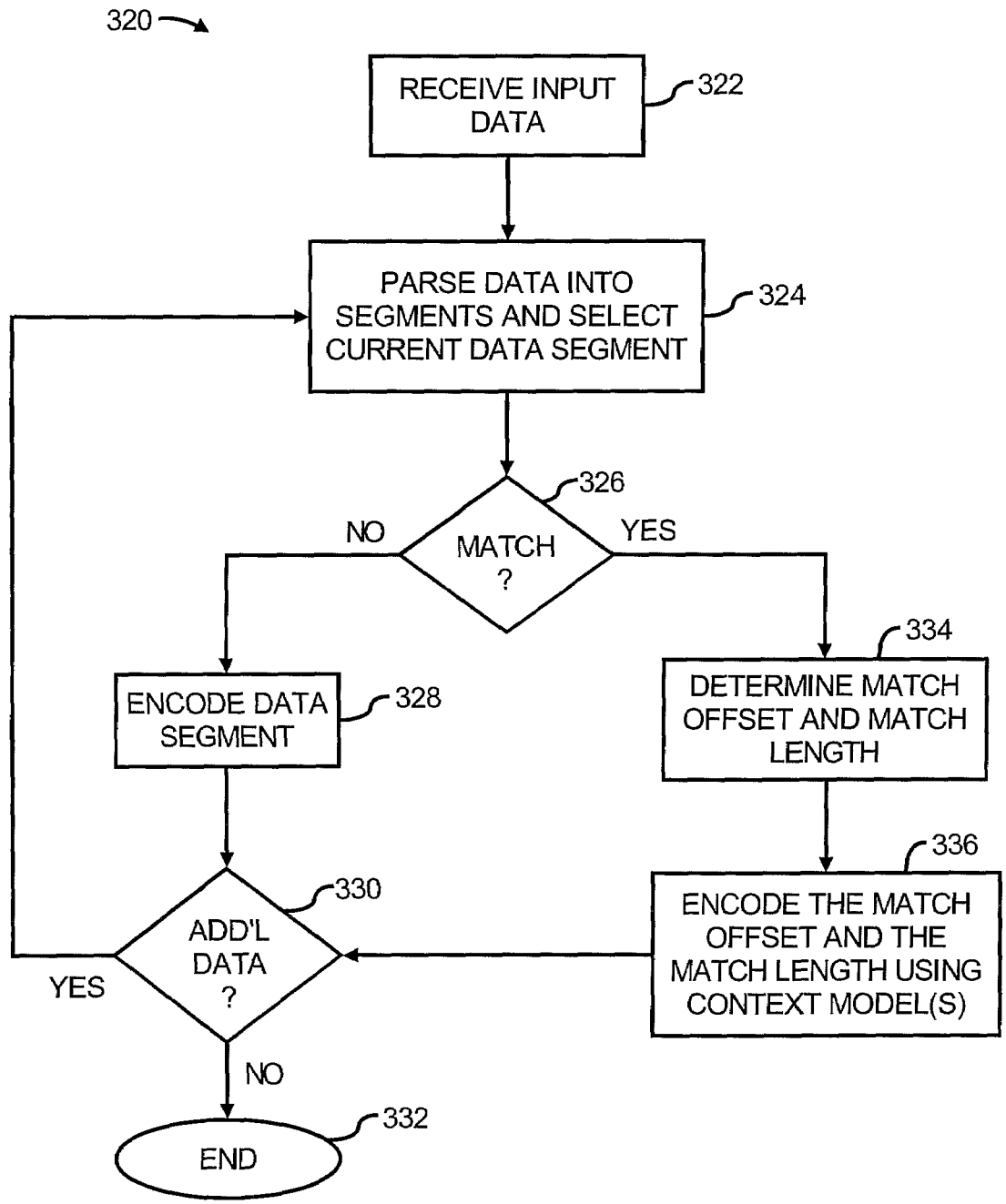
FIG. 3B depicts a more detailed flow diagram of the steps contained in the method of compressing depicted in FIG. 3A, according to an embodiment of the invention.

Steps 302 and 304 are described in greater detail with respect to the method 320 depicted in FIG. 3B, which is also a flow diagram of a method 320 of compressing a data sequence, according to an example. Step 306 is described in greater detail with respect to the method 600 depicted in FIG. 6, which is also a flow diagram of a method 600 of decompressing a coded data sequence, according to an example.

With reference first to FIG. 3B, the method 320 may be initiated at step 322 through receipt of a stream of input data 202 to be compressed. Once initiated, the parsing unit 210 may parse the input data 202 into a plurality of data segments and may select a current data segment as indicated at step 324.

At step 326, the current data segment may be compared with previously coded data to determine whether the current data segment comprises a match 110 with part of the previously coded data. For instance, the parsing unit 210 may determine whether a current data segment is a literal 212 or a match 110. If it is determined that the current data segment is the first data segment being compared or that the current data segment does not match a previous data segment, the current data segment may be deemed a literal 212 and may be encoded. More particularly, at step 328, the literal coding unit 222 may encode the current data segment using any reasonably suitable algorithm for encoding literals, such as those described in LZ77, LZMA, and the like.

At step 330, a determination as to whether any additional input data 202 is to be coded may be made. For instance, the parsing unit 210 may determine whether the input data 202 includes additional data to be coded at step 330. If it is determined that all of the input data 202 has been encoded, the method 300 may end as indicated at step 332. Following step 332, the coded data 204 may be outputted to a data storage device, transmitted to a receiving device, etc. In addition, or alternatively, the coded data 204 may be transmitted to a decoder 250.

If, however, at least one data symbol remains to be coded, the parsing unit 210 may again parse the input data 202 and may select another data segment, such as, the next data segment in a sequence of data segments forming the input data 202, as indicated at step 324. In addition, at step 326, the parsing unit 210 may compare the current data segment with previously coded data to determine whether there is a match. If the current data segment is found to be a match 110 with previous coded data, the parsing unit 210 may determine the match offset and the match length of the match 110, as indicated at step 334.

According to an example, at step 334, the parsing unit 210 may constrain the match offsets to be greater than zero and the match lengths to be greater than a predetermined minimum match length. In this example, the encoder 200 does not consider matches 110 having match lengths that are shorter than the predetermined minimum length. In addition, the encoder 200 processes the symbols contained in those matches 110 as literals. As such, a modified match offset, determined by subtracting 1 from the actual match offset, and a modified match length, determined by subtracting the predetermined minimum match length, may be computed. In addition, the encoder 200 may encode the modified match offset and the modified match length at step 336. The actual values of the match offset and the match length may be reconstructed by a decoder by decoding the encoded modified values and adding back the subtracted values.

According to another example, the parsing unit 210 may also constrain the modified match offsets to have relatively shorter lengths than are possible if the entire length of the match were included in the modified match offsets. Thus, the parsing unit 210 may be configured to constrain the modified match offsets to have maximum lengths in addition to or alternatively to the minimum lengths discussed above.

In any regard, the encoder 200 may encode the modified match offset and the modified match length using at least one context model as indicated at step 336. As described above, the at least one context model may comprise a model that depends upon one or more coded data symbols that are known to a decoder 250 that has decoded all previously encoded data. Various manners in which the encoder 200 may encode the modified match offset and the modified match length of a match 110 are described in greater detail herein below with respect to the following flow diagram.

After the modified match offset and the modified match length have been encoded, a determination as to whether any additional input data is to be coded may be made at step 330. Again, if it is determined that all of the data segments forming the input data 202 have been encoded, the method 300 may end as indicated at step 332. In addition, the coded data 204 may be outputted to a data storage device, transmitted to a receiving device, etc., following step 332. In addition, or alternatively, the coded data 204 may be transmitted to a decoder 250 following step 332.

Steps 324-336 may be repeated, however, for any input data 202 remaining to be encoded.

With reference now to FIG. 4, there is shown a flow diagram of a method 400 of using context modeling to compress the least significant bits (LSBs) of modified match offsets 216a and modified match lengths 216b, according to an example. The method 400 may be considered as providing a more detailed depiction of step 336 in the method 320.

At step 402, the MSBs 214a/214b and the LSBs 216a/216b of the modified match offset and the modified match length determined at step 334 may be determined. In addition, the MSB coding unit 224 may encode the modified match offset MSBs 214a and the modified match length MSBs 214b at step 404 through any reasonably suitable manner, such as, any of those manners described in LZ77, LZMA, and the like. The encoded modified match offset MSBs 214a and modified match length MSBs 214b may also be transmitted to the decoder 250 at step 404.

At steps 406 and 408, respectively, context modeling may be used during encoding of the modified match offset LSBs 216a and the match length LSBs 216b. More particularly, for instance, at step 406, the context of the current symbol that starts the match 110 and the context in an uncertainty window in which the match 110 is located are considered in coding the modified match offset LSBs 216a. The location of, and hence, contexts in the uncertainty window may be derived from the more significant bits of the modified match offset. In other words, in an example where the number of least significant bits is set to two (2), after the MSBs (all but the 2 LSBs) are known to the decoder 250, the decoder 250 knows that the starting position of the match 110 is in one of four positions (the uncertainty window) based upon the values of the more significant bits. It should, however, be understood that the number of the least significant bits may be set to any reasonably suitable number.

In keeping with the example where the least significant bits is set to two (2), and in order for the decoder 250 to accurately predict the starting position of the match 110, the encoder 200 may use the values of the four contexts in the uncertainty window and the value of the context in the next symbol to be compressed that is going to start the repetition 110 (or match) to predict the modified match offset LSBs 216a. The prediction may be based, for instance, on the concept that, more likely than not, if one of those contexts of the symbols in the uncertainty window is the same as the context for the next symbol to be coded (that is going to start the repetition), the match 110 will start at that symbol.

In addition, depending upon the value of the context of the symbol that starts the match 110, and the contexts of the symbols in the uncertainty window, the LSBs 216a will have different distributions. Moreover, at step 406, shorter code lengths may be assigned to the more likely values of those bits using arithmetic coding driven by per context likelihood/probability estimates, according to an example.

As discussed above, two levels or hierarchies of contexts exist. One of the levels is the context of each symbol, such as the value of the previous symbol, a function with regard to the previous symbol, etc. Another of the levels is a sort of meta context for compressing the LSBs 216a from the values of the first level of contexts. At steps 406 and 408, second levels of contexts are built for compressing the LSBs 216a, 216b of the modified match offsets and the modified match lengths. In comparison to other compression algorithms, such as, LZMA, for example, steps 406 and 408 do not employ data symbol dependent contexts for the LSBs 216a, 216b, but instead, models the LSBs 216a, 216b using contexts that are determined independently of previous data symbols and independently of functions of previously encoded data symbols.

By way of particular example and not of limitation, the LSBs of the match offset may be set to two (2) and the match offset may be equal to the number "156" for a particular case. In this example, the match offset will be encoded as the number "155" because the match offset is at least "1" as discussed above. The binary (base 2) representation of the number "155" is "10011011". In this example, the LSBs 216a of the modified match offset are "11" and the MSBs 214a of the modified match offset is "100110".

As discussed herein, by compressing the LSBs 216a/216b separately from the MSBs 214a/214b, a greater level of compression may be obtained as compared with compressing all of the bits of the match offset and the match length together. However, separate compression of the LSBs 216a/216b results in an uncertainty window of where the match starts and ends because that information is contained in the LSBs 216a/216b.

The size of the uncertainty window is determined by the number of least significant bits, which may be preset. Thus, for a match offset, the bits for the MSBs 214a are known to the decoder prior to it having to decode the LSBs 216a because they have been encoded and received by the decoder 250 and the only unknowns are the bits for the LSBs 216a. By way of example, if the MSBs were known to have the values 11011 and the number of LSBs is set to 3, the match is known to fall within an uncertainty window equal to 8, which is 2 to the power of 3. Thus, in this example, if the 3 bits were all zeros, then the number would be 216 (11011000 in binary), which corresponds to 3 bits being zero. The next larger number would be 217 and so on, all the way up to 223, which corresponds to all of the bits being one (1). The uncertainty window in this example is therefore between 216 and 223, inclusive.

The LSBs 216a of the modified match offset are compressed using symbol contexts of the symbols contained in the uncertainty window along with the symbol context of the current symbol. More particularly, for instance, decoder 250 uses the symbols contained in the uncertainty window to try and predict the values of the LSBs 216a of the modified match offset.

The LSBs 216b of the modified match length are compressed through use of a similar process. In this process, instead of looking at the beginning of the match, the end of the match is considered because the total length of the match is sought. In addition, the match offset is presumed to be known to the decoder prior to it having to decode the match length and thus the location of the start of the match is known. Furthermore, assuming that the number of LSBs 216b of the match length is set to 3, then all but 3 least significant bits of the length are specified, which is an indication, given the values of the MSBs, that the match will end in an uncertainty window having one of eight positions, as described above. Again, the symbols contained in the uncertainty window are used to compress the LSBs 216b. More particularly, a prediction as to where the match might end is made based on the symbols contained in the uncertainty window.

A more mathematical approach to how the LSBs 216a, 216b are compressed using context modeling is described in greater detail in the following sections.

For purposes of this description, it is assumed that the least significant k bits of the modified match offset and the least significant/bits of the modified match length are to be respectively encoded at steps 406 and 408. In addition, it is also assumed that associated with each symbol ($x_i$), denoting the i-th symbol in the data, is a finite valued symbol context ($c_i$) that may be determined from only the symbols preceding the i-th symbol.

The symbol context ($c_i$) may be determined in various manners depending upon, for instance, the nature of the input data 202 to be coded. For instance, in a relatively simple example, the symbol context ($c_i$) may be the value of the previous immediately preceding symbol. In another example, the symbol context ($c_i$) may be the value of some other previous preceding symbol. In a further example, the symbol context ($c_i$) may comprise a Markovian context: some function of t preceding symbols. In a yet further example, where the input data 202 comprises executable code, for instance, the value of the symbol context ($c_i$) may be tailored to the executable code itself and the type of processor configured to implement the executable code, as described in greater detail herein below. The value of the symbol context ($c_i$) may be tailored in certain instances because various aspects of the input data 202 may be employed in building the context model.

Figures 5A, 5B:
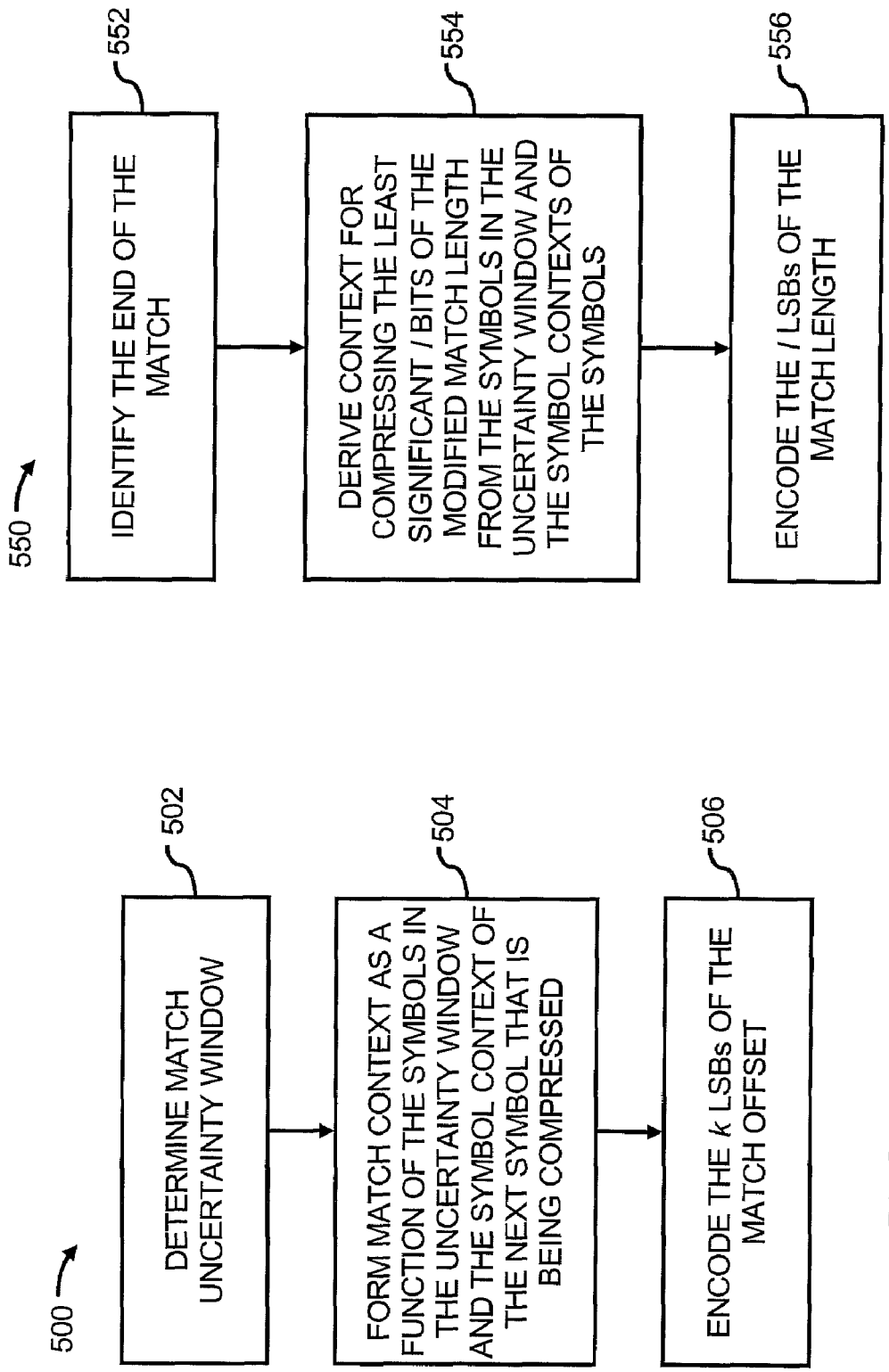
FIG. 5A depicts a flow diagram of a method that depicts in greater detail the step of encoding the LSBs of the match offset using context modeling in FIG. 4, according to an embodiment of the invention.
FIG. 5B depicts a flow diagram of a method that depicts in greater detail the step of encoding the LSBs of the match length using context modeling in FIG. 4, according to an embodiment of the invention.

Based upon the assumptions above, step 406 is described in greater detail with respect to the flow diagram of a method 500 depicted in FIG. 5A. As shown in FIG. 5A, at step 502, a match uncertainty window is determined. More particularly, given all but the least significant k bits 216a of the modified match offset for a match 110 beginning at position i in a sequence of the input data 202, the start of the match 110 may be narrowed down to occur within a match uncertainty window of $2^k$ consecutive symbol indices. The start of the match may be narrowed down to the match uncertainty window because all but the least significant k bits of the modified match offset have already been sent to the decoder at step 404.

In any regard, let v, a vector, denote the sequence of $2^k$ symbol contexts $\{c_j\}$ corresponding to the symbols in this match uncertainty window. The start of the match 110 is considered to be within some uncertainty window that is $2^k$ symbols because there are k bits that are unknown to the decoder at this point and those k bits may have one of $2^k$ sets of values.

The symbol context ($c_i$) may be used for a higher level context, which is called a match context for purpose of this disclosure. The uncertainty window where the match 110 starts may be used to determine the match context. Additionally, at step 504, for instance, the match context may be formed as a function also of the symbol context ($c_i$) of the next symbol that is being compressed, which is the start of the repetition. As such, it is known that a match 110 that includes the next symbol exists. The value of the next symbol is unknown to the decoder 250; however, its symbol context ($c_i$) is known because that symbol context ($c_i$) may be computed from the previous symbols. In addition, the symbol contexts ($c_i$) for every symbol in the uncertainty window are known to the decoder at this point because the match 110 is in the previously encoded data. Through use of all of the previously cited symbols, the symbol contexts ($c_i$) and the values of the symbols themselves may be determined.

As such, the match context may be formed by applying some function to the symbol contexts in the match uncertainty window and the symbol context ($c_i$) of the new symbol that is part of the match. By way of example, the match context for compressing the least significant k bits of the modified match offset may be obtained as a function of v and $c_i$, for instance, $f(v,c_i)$. An example of a possible function is a binary vector of length $2^k$ given by:

$$f(v,c_i)=[d(v(1),c_i), d(v(2),c_i), \ldots, d(v(2^k),c_i)]. \quad \text{Equation (1)}$$

In Equation (1), $d(x,y)=1$, if $x=y$, and $d(x,y)=0$, if $x \neq y$, and $v(j)$ denotes the j-th symbol context ($c_i$) in the match offset uncertainty window. The motivation for Equation (1) is that the symbol context ($c_i$) of the symbol ($x_i$) starting a repetition should, more often than not, coincide with the symbol context ($c_i$) of the starting point of the match within the uncertainty window.

The LSB coding unit 226 may then encode the k least significant bits of the modified match offset at step 506, using, for instance, arithmetic coding and separate probability distribution estimates on the k bits for each value of the context function $f(v,c_i)$ described above.

With reference now to FIG. 5B, there is shown a flow diagram of a method 550 which describes step 408 in greater detail. As shown in FIG. 5B, the end of the match may be identified at step 552. More particularly, given the match offset, which has been encoded and sent to the decoder 250 at step 404, and all but the l least significant bits of the modified match length, the end of the match 110, which defines the match length, may be narrowed down to occur within an uncertainty window of $2^l$ symbols. In other words, the modified match length MSBs 214b have been encoded and sent to the decoder 250 at step 404, thereby leaving the modified match length LSBs 216b. In addition, it may be assumed that the match offset is sufficiently far from the current data segment that the entire match 110 fits into the previously encoded data. More particularly, it is assumed that the uncertainty window of $2^l$ symbols falls completely before index i. As such, the symbol contexts ($c_i$) for all $2^l$ symbols within the uncertainty window are available for compressing the l least significant bits. Let w denote this sequence of symbol contexts.

At step 554, the context for compressing the least significant bits of the modified match length is then derived as a function of w, for instance, the function g(w). According to an example, the function g(w) may comprise the identity function $[w(1), w(1), \ldots, w(2^l)]$, on the basis, for instance, that matches 110 may be more likely to terminate at symbols with certain symbol contexts than others. By way of example, in a processor instruction, it is more likely that the match 110 will end at an instruction boundary rather than in the middle of the instruction.

The LSB coding unit 226 may then encode the least significant l bits of the modified match length at step 556, similarly to the modified match offset, for instance, using arithmetic coding and separate probability distribution estimates on the l bits for each value of g(w).

The method 550 may be extended to also handle the case when the uncertainty window ends after the index i. In this case, the sequence as known to the decoder 250 is extended beyond i as if the modified match length were as large as possible given all but the l least significant bits. The sequence w above would then correspond to the trailing $2^l$ symbols of this artificially extended sequence, and the modeling and compression of the l least significant bits would proceed as described above.

Figure 6:
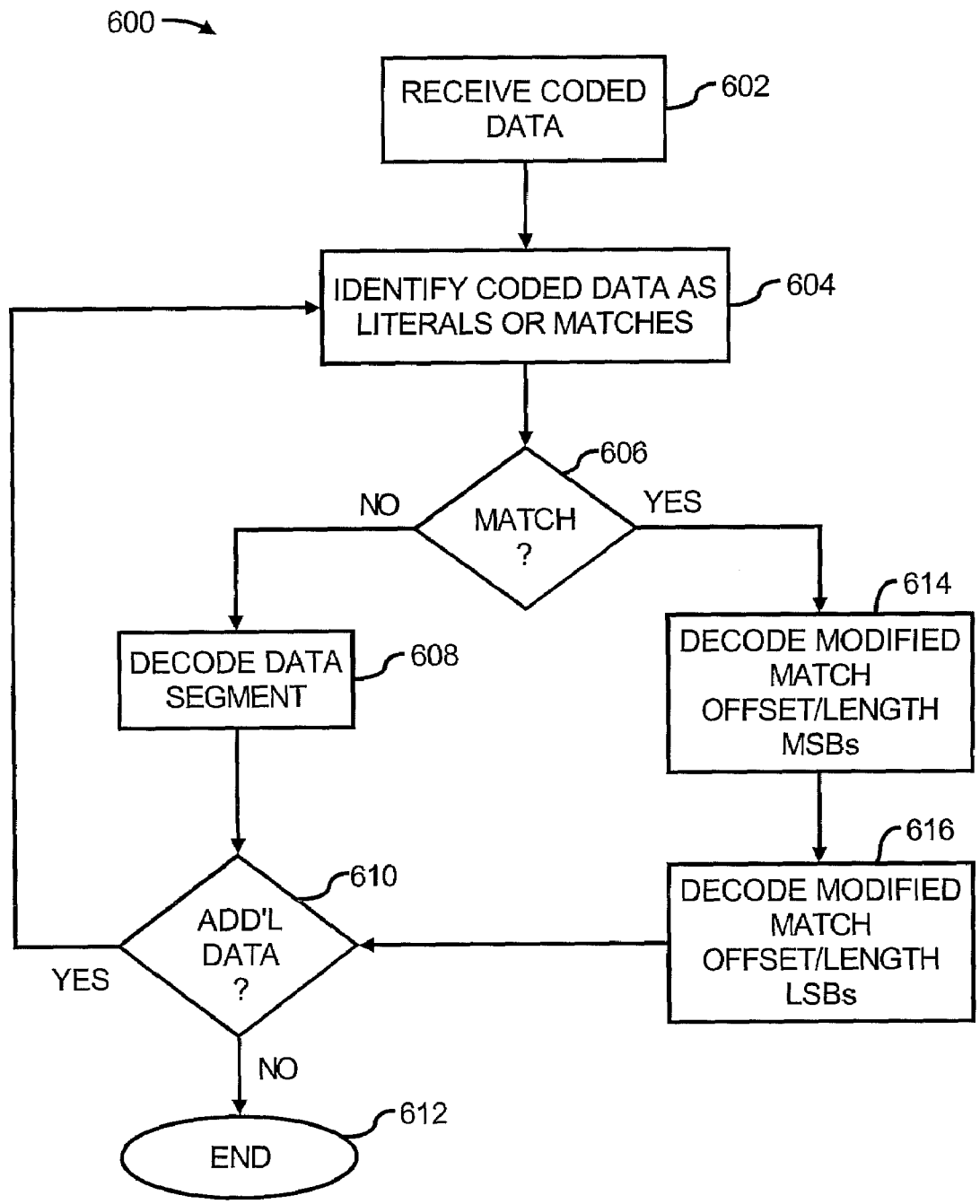
FIG. 6 depicts a flow diagram of a method of decompressing a data segment that has been encoded using context modeling to compress the least significant bits of a match offset and a match length, according to an embodiment of the invention.

With reference now to FIG. 6, there is shown a method 600 of decompressing a coded data sequence, according to an example. As shown therein, at step 602, the decoder 250 receives data that has been coded by the encoder 200. As described above with respect to FIG. 2B, the coded data 204 includes coded flag information identifying whether the data segments comprise literals or matches. In this regard, at step 604, the decoder 250 invokes or implements the identification unit 260 to decompress the coded flag information and identify whether the coded data segment is a coded literal 262 or a coded match from the decompressed flag information.

If the identification unit 260 determines that a coded data segment does not comprise a match at step 606, the decoder 250 is configured to invoke or implement the literal decoding unit 272 to decode the coded literal 262 at step 608 through any reasonably suitable algorithm for decoding literals, such as those described in LZ77, LZMA, and the like. The decoder 250 may also determine whether there are additional data segments to be decoded at step 610 and may end the method 600 at step 612 if the decoder 250 determines that there is no additional data to be decoded. In addition, the decoded literals may be outputted as decompressed data 204.

If, however, the identification unit 260 determines that a coded data segment comprises a match at step 606, the decoder 250 may invoke or implement the MSB decoding unit 274 to decode the coded modified match offset MSBs 264a and the coded modified match length MSBs 264b, at step 614. As described above, the modified match offset MSBs 264a and the modified match lengths 264b have been encoded using at least one context model. As such, at step 614, the MSB decoding unit 274 is configured to decode the modified match offset MSBs 264a and the modified match length MSBs 264b based upon one or more data symbols that the decoder 250 has previously decoded.

At step 616, the decoder 250 may invoke or implement the LSB decoding unit 276 to decode the coded modified match offset LSBs 266a and the coded modified match length LSBs 266b. Again, as described above, the modified match offset LSBs 266a and the coded modified match length LSBs 266b have been compressed through use of context modeling. As such, the LSB decoding unit 276 is configured to determine values for the modified match offset LSBs 266a and the coded modified match length LSBs 266b based upon the contexts corresponding to the modified match offset LSBs 266a and the coded modified match length LSBs 266b.

The LSB decoding unit 276 is configured to use the decoded modified match offset MSBs 264a to determine the values of the modified match offset LSBs 266a. More particularly, for instance, the decoder 250 derives the location of the contexts in the uncertainty window of where the match 110 starts from the decoded modified match offset MSBs 264a. In other words, in an example where the number of LSBs is set to two (2), after the decoder has decoded the modified match offset MSBs (all but the 2 LSBs), the decoder 250 knows that the starting position of the match 110 is in one of four positions (the uncertainty window) based upon the values of the more significant bits.

In addition, the match offset LSB decoding unit 276 uses the values of the four contexts in the uncertainty window and the value of the context in the next symbol to be decompressed that starts the repetition 110 to form the context for the modified match offset LSBs 216a, and thereby, in a sense, attempt to predict these LSBs. This prediction may be based, for instance, on the concept that, more likely than not, if one of those contexts of the symbols in the uncertainty window is the same as the context for the next symbol to be coded (that is going to start the repetition), the match 110 will start at that symbol.

At step 616, the decoder 250 may invoke or implement the LSB decoding unit 276 to decode the coded modified match length LSBs 266b. More particularly, for instance, the decoder 250 is configured to decode the coded modified match length LSBs 266b based upon the decoded modified match length MSBs 264b and the completely decoded modified match offset.

According to an example, the steps outlined in the methods 300, 320, 400, 500, 550, 600 may be implemented in compressing and decompressing executable code. Embedded processors are typically used in computing devices to implement various functionalities in the computing devices. The software, or firmware, that runs on an embedded processor is typically stored in non-volatile flash memory on the computing device and is loaded into the processor during a start-up process. By compressing the executable code that is loaded into the processor as discussed below, the amount of memory required by the executable code may be reduced, thereby reducing the size and the costs of the flash memories.

In compressing the executable code, because a greater understanding of how executable code behaves is available, prior knowledge of how the executable code is designed may be employed in tailoring the context model employed in compressing the modified match offset LSBs 216a and the modified match length LSBs 216b of the executable codes. In addition, the contexts may be considered as the output of a type of finite state machine that evolves based upon the values of symbols as they are observed.

This executable code example is described with reference to an instruction set for a processor, such as, the ColdFire™ processor available from Motorola, Inc. of Schaumburg, Illinois. Thus, the data of the previous general discussion corresponds in this example to executable code which is to be compressed and the symbols $x_i$ correspond to successive bytes of the executable code. The ColdFire™ instruction set has variable length instructions, namely two bytes, four bytes, and six bytes. In addition, an instruction may be 1, 2, or 3 words long, with each word having two bytes, and the symbol context $c_i$ of each byte (or symbol $x_i$) may be chosen as one of 0, 1, 2, or 3, and is determined as follows:

0: contained in first word of an instruction;
    1: contained in second word of a 2 word instruction;
    2: contained in second word of a 3 word instruction; and
    3: contained in third word of a 3 word instruction.

The context may have one of the four values listed above and may be interpreted as the phase in the instruction that the byte has. For instance, the context determines where the byte is in the instruction. So, for example, the context value "0" indicates that the byte is in the first word of an instruction. In this case, the number of words contained in the instruction remains unknown to the decoder 250. However, the encoding of the instruction set, for instance, for the ColdFire™ processor, has the property that the length of an instruction may be inferred from the value of the first instruction word, that is, the first two bytes of the instruction. Assuming the position of the first byte in the executable code is 1, for any integer j the symbols $x_{2j+1}$ and $x_{2j+2}$ have the same context. That is, a symbol with an odd position index and the immediately succeeding symbol will be assigned the same context.

This property, along with the nature of the contexts discussed herein above, implies that the symbol context $(c_{2i+1})$ of a current pair of symbols $(x_{2i+1}, x_{2i+2})$ may be determined from the context and/or value of previously encoded symbols $(x_{2i-1}, x_{2i})$. This enables the symbol context $(c_{2i+1})$ of a current symbol $(x_{2i+1})$ to be used as part of the context model for compressing the match offset and the match length encompassing the current symbol $(x_{2i+1})$. Assume that T(x,y) is a table that given the bytes x and y returns the length of a Coldfire™ instruction whose first word is comprised of the bytes (x,y). Then the symbol context $c_{2i+1}$ of a pair $x_{2i+1}, x_{2i+2}$ is determined according to the finite state update rule $u(c_{2i-1}, x_{2i-1}, x_{2i})$:

$$u(c_{2i-1}, x_{2i-1}, x_{2i}) = 0 \text{ if } c_{2i-1} = 1 \text{ or } 3$$
$$= 1 \text{ if } c_{2i-1} = 0 \text{ and } T(x_{2i-1}, x_{2i}) = 2$$
$$= 2 \text{ if } c_{2i-1} = 0 \text{ and } T(x_{2i-1}, x_{2i}) = 3$$
$$= 3 \text{ if } c_{2i-1} = 2$$

where $C_{2i-1}$ can be interpreted as the running value of the state.

According to a first example in which the methods 300, 320, and 400 are implemented to compress Coldfire™ executable code, modified match offset LSBs 216a and modified match length LSBs 216b would thus be compressed according to the procedure outlined above, with the above Coldfire™ specific symbol contexts determining the symbol contexts $c_i$ in the procedure. In one example, k and l, the number of modified match offset LSBs 216a and modified match length LSBs 216b, would both be set to 2. Additionally, the function f used to determine the second level of contexts from the symbol contexts would be the function in Equation (1) discussed above. In addition, the function g used to form the length related context would be the identify function, as also discussed above.

According to another example, the resulting contexts are augmented, in the case of the modified match offset, with a flag indicating if the value of the position index of the next symbol to be encoded is odd or even, and in the case of the modified match length, with a flag indicating if the value of the position index of the first symbol in the match length uncertainty window is odd or even. This augmentation splits each of the aforementioned contexts in the first example above into two, and are selected based on the value of the additional even/odd position index flag.

According to a further example, the data to be compressed may comprise English text. In this example, the value of $x_{i-1}$, the previously occurring symbol or some function thereof, may be used to derive the second level of modified match offset and modified match length contexts as described above. In this example, the previously occurring symbol or function thereof may indicate, for instance, whether the previous symbol is a consonant, a vowel, or a non-letter (such as, whitespace, a punctuation, etc.).

Through implementation of the methods 300, 320, and 400, the labeling of executable code is incorporated into context models for compressing the literals, match offsets, and match lengths, in a compression process, such as, LZMA. In one regard, therefore, the method 300, 320, and 400 may be implemented as an enhancement to existing compression algorithms, such as, the LZMA algorithm.

The operations set forth in the methods 300, 320, 400, and 600 may be contained as a utility, program, or subprogram, in any desired computer accessible medium. In addition, the methods 300, 320, 400, and 600 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 7:
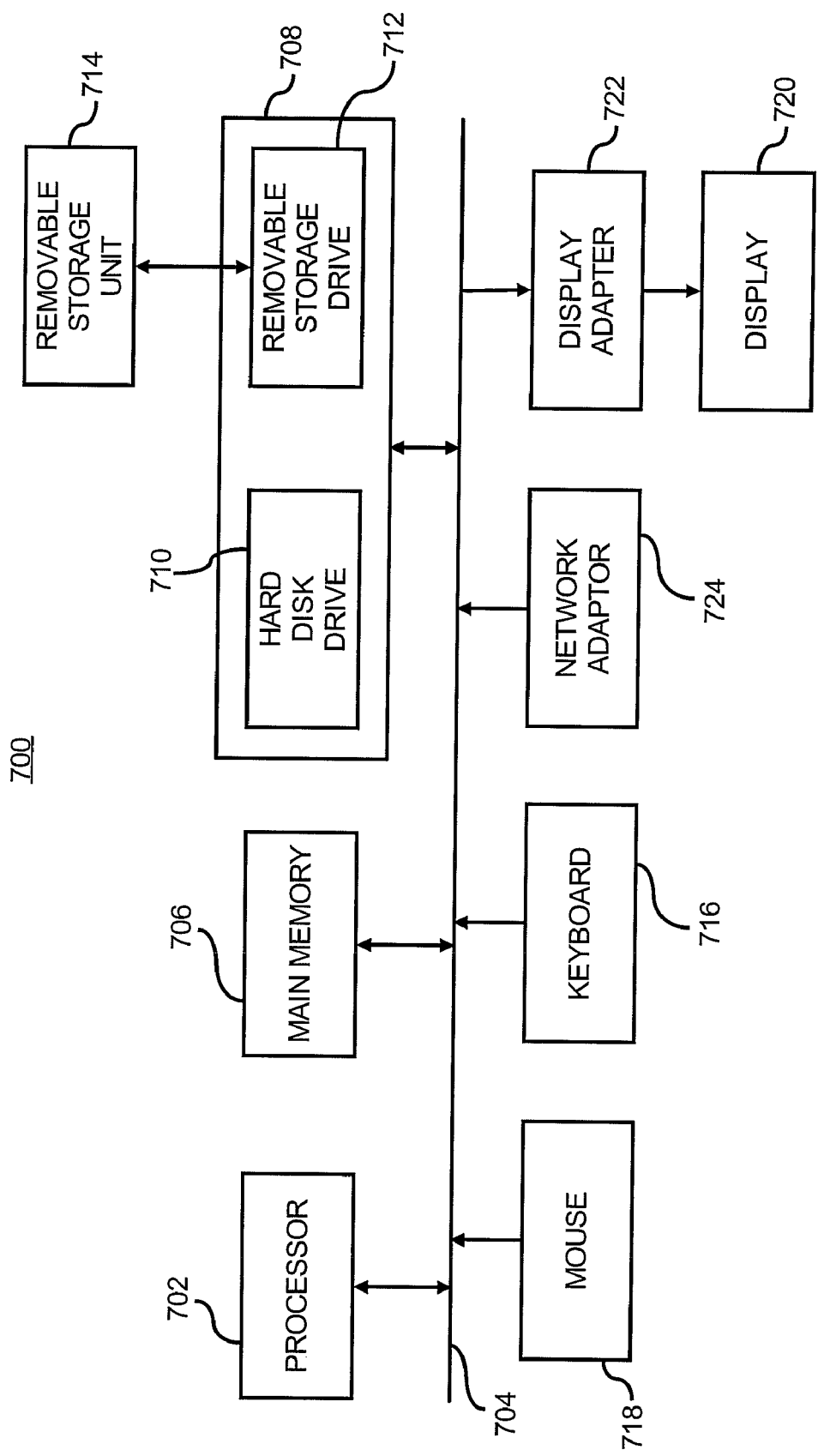
FIG. 7 illustrates a computer system, on which the encoder depicted in FIG. 2 may be stored as hardware, firmware, or software, according to an embodiment of the invention.

FIG. 7 illustrates a computer system 700, on which at least one of the encoder 200 and the decoder 250 disclosed herein may be stored as hardware, firmware, or software, according to an example. In this respect, the computer system 700 may be used as a platform for executing one or more of the functions described hereinabove with respect to either or both of the encoder 200 and the decoder 250.

The computer system 700 includes a processor 702, which may be used to execute some or all of the steps described in the methods 300, 320, 400, 500, 550, and 600. Commands and data from the processor 702 are communicated over a communication bus 704. The computer system 700 also includes a main memory 706, such as a random access memory (RAM), where the program code for either or both of the encoder 200 and the decoder 250 may be executed during runtime, and a secondary memory 708. The secondary memory 708 includes, for example, one or more hard disk drives 710 and/or a removable storage drive 712, representing a floppy diskette drive, a magnetic tape drive, a compact disk drive, etc., where a copy of the program code for compressing a data sequence may be stored.

The removable storage drive 710 reads from and/or writes to a removable storage unit 714 in a well-known manner. User input and output devices may include a keyboard 716, a mouse 718, and a display 720. A display adaptor 722 may interface with the communication bus 604 and the display 620 and may receive display data from the processor 702 and convert the display data into display commands for the display 720. In addition, the processor 702 may communicate over a network, for instance, the Internet, LAN, etc., through a network adaptor 724.

It will be apparent to one of ordinary skill in the art that other known electronic components may be added or substituted in the computer system 700. In addition, the computer system 700 may include a system board or blade used in a rack in a data center, a conventional "white box" server or computing device, etc. Also, one or more of the components in FIG. 7 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A method of compressing a data sequence, said method comprising:

parsing the data sequence into data segments, wherein at least one of the data segments includes a match;

determining a match offset and a match length of the match;

determining a modified match offset and modified match length by respectively subtracting minimum values from the match offset and the match length;

determining most significant bits and least significant bits of at least one of the modified match offset and the modified match length; and compressing at least one of the match offset and the match length by compressing the least significant bits of at least one of the modified match offset and the modified match length using at least one context model that depends upon one or more coded data symbols that are available to a decoder.

2. The method according to claim 1, wherein the match includes a current symbol that starts a repetition and an uncertainty window in which the match is located, and wherein the step of compressing further comprises compressing the modified match length least significant bits through use of a context that depends on at least one symbol in an end-of-match uncertainty window.

3. The method according to claim 1, wherein the data sequence comprises an instruction code configured to be executed by a processor, wherein the instruction code comprises a finite number of instructions and an instruction comprises a finite number of words, and wherein the context identifies the location of a word in the instruction.

4. The method according to claim 1, wherein compressing at least one of the modified match offset and the modified match length further comprises compressing at least one of the modified match offset and the modified match length through arithmetic coding.

5. The method according to claim 1, wherein the match includes a current symbol that starts a repetition and an uncertainty window in which a start of the match is located, and wherein the method further comprises:

deriving at least one context using at least one symbol in the uncertainty window derived from the most significant bits of the modified match offset.

6. The method according to claim 5, wherein the step of compressing further comprises modeling the modified match offset least significant bits based upon the at least one context.

7. The method according to claim 5, further comprising:
forming a match context by applying a function to the at least one context of at least one symbol located in the uncertainty window and a symbol context of a new symbol that is part of the match.

8. The method according to claim 7, wherein the step of compressing further comprises compressing the least significant bits of the modified match offset using separate probability distribution estimates on the least significant bits for each value of the function of the at least one context of a symbol located in the uncertainty window.

9. An encoder comprising:
a coding unit configured to code at least one of a modified match offset and a modified match length of a data segment using one or more context models that depend on previously decodeable data symbols,
wherein the modified match offset comprises most significant bits and least significant bits and the modified match length comprises most significant bits and least significant bits, and
wherein the coding unit is further configured to code at least one of the modified match offset least significant bits and the modified match length least significant bits using the one or more context models.

10. The encoder according to claim 9, wherein the coding unit is further configured to model the at least one of the modified match offset least significant bits and the modified match length least significant bits based upon the one or more contexts.

11. The encoder according to claim 9, wherein the match includes a current symbol that starts a repetition and an uncertainty window in which a start of the match is located, and wherein the coding unit is further configured to derive at least one context using at least one symbol in the uncertainty window derived from the most significant bits of the modified match offset.

12. The encoder according to claim 9, further comprising:
a parsing unit configured to parse a stream of data into the data segments, said parsing unit being configured to compare the data symbols with previously received data symbols to identify matches and to determine match offsets and match lengths of identified matches.

13. The encoder according to claim 9, wherein the data is part of an instruction code configured to be executed by a processor, and wherein the coding unit is further configured to compress the data.

14. A computer readable storage medium on which is embedded one or more computer programs, said one or more computer programs implementing a method for compressing a data sequence, said one or more computer programs comprising a set of instructions for:
parsing the data sequence into data segments, wherein at least one of the data segments includes a match;
determining a match offset and a match length of the match;
determining a modified match offset and modified match length by respectively subtracting minimum values from the match offset and the match length;
determining most significant bits and least significant bits of at least one of the modified match offset and the modified match length; and
compressing at least one of the match offset and the match length using by compressing the least significant bits of at least one of the modified match offset and the modified match length using at least one context model that depends upon one or more coded data symbols that are available to a decoder.

15. The computer readable medium according to claim 14, further comprising a set of instructions for:
determining the modified match offset and modified match length by respectively subtracting minimum values from the match offset and the match length.

16. The computer readable medium according to claim 14, further comprising a set of instructions for:
modeling the at least one of the modified match offset least significant bits and the modified match length least significant bits based upon the at least one context.

17. A method of decompressing a coded data sequence, said method comprising:
receiving a coded data segment, wherein the coded data segment comprises at least one of a modified match offset and a modified match length of the data segment wherein the modified match offset and the modified match length have respective most significant bits and least significant bits, and wherein the least significant bits of at least one of the modified match offset and the modified match length has been coded using one or more context models that depends upon one or more coded data symbols that are available to a decoder; and
decompressing the received coded data segment.

* * * * *

UNITED STATES PATENT AND TRADEMARK OFFICE
CERTIFICATE OF CORRECTION

PATENT NO. : 7,623,047 B2
APPLICATION NO. : 11/929393
DATED : November 24, 2009
INVENTOR(S) : Erik Ordentlich et al.

It is certified that error appears in the above-identified patent and that said Letters Patent is hereby corrected as shown below:

In column 18, line 40, in Claim 17, delete "segment" and insert -- segment, --, therefor.

Signed and Sealed this

Sixth Day of April, 2010

David J. Kappos
*Director of the United States Patent and Trademark Office*